(12) United States Patent
Achouche et al.

(10) Patent No.: US 7,505,645 B2
(45) Date of Patent: Mar. 17, 2009

(54) INTEGRATED OPTOELECTRONIC DEVICE INCLUDING A SEMICONDUCTOR OPTICAL AMPLIFIER AND A PHOTODIODE (75) Inventors: Mohand Achouche, Montrouge (FR); Romain Brenot, Paris (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 11/498,254

(22) Filed: Aug. 3, 2006

(65) Prior Publication Data
US 2007/0092192 A1 Apr. 26, 2007

(30) Foreign Application Priority Data
Aug. 5, 2005 (FR) .................... 05 08386

(51) Int. Cl.
*G02B 6/12* (2006.01)
(52) U.S. Cl. ......................................... 385/14; 385/129
(58) Field of Classification Search .................. 385/14, 385/129, 43
See application file for complete search history.

(56) References Cited

U.S. PATENT DOCUMENTS

| 6,330,378 | B1 * | 12/2001 | Forrest et al. ................. 385/14 |
| 2005/0185889 | A1 * | 8/2005 | Xia et al. ...................... 385/43 |
| 2006/0093369 | A1 * | 5/2006 | Nagarajan .................... 398/135 |

FOREIGN PATENT DOCUMENTS

WO         01/88577      11/2006

OTHER PUBLICATIONS

John M. Hutchinson et al.; "Monolithically integrated InP-based tunable wavelength conversion" Proceedings of SPIE vol. 5349, 2004, pp. 176-184; Physics and Simulation of Optoelectronic Device XII; Bellingham, WA, 2004; Xp-002372445.

Joachim Piprek et al; "3D Simulation of an Integrated Wavelength Converter" Physics and Simulation of Optoelectronics Device XII; Proceeding of SPIE vol. 5349 pp. 185-196; Bellingham, WA, 2004; XP-002372446.

Joe C. Campbell et al; "New Developments in High Speed Photodetectors"; Lasers and Electro-Optics, 2004.(CLEO); Conference on San Franciso, CA, USA May 20-21, 2004, Piscataway, NJ, USA, IEEE, vol. 2, May 20, 2004; pp. 251-251; XP-0100744666; ISBN: 1-55752-777-6.

(Continued)

*Primary Examiner*—Ellen Kim
(74) *Attorney, Agent, or Firm*—Lowe Hauptman Ham & Berner, LLP (57) ABSTRACT

The field of the invention is that of optoelectronic devices for receiving high bit rate digital optical signals for telecommunications applications, comprising an optical amplifier and a photoreceiver diode.

Generally, the two optical amplification and optical-electrical conversion functions are integrated in a common component, resulting in lower production costs, smaller footprint and improved reliability.

To optimize the conversion device as a whole, it is demonstrated that there must be an active area of small thickness in the amplifier part and greater thickness in the conversion part.

The invention proposes to implement this function by means of a structure comprising a diluted multimode waveguide common to the two amplification and reception sections, the first active area and the second area being disposed so as to ensure a coupling by evanescent waves with said diluted multimode waveguide.

13 Claims, 6 Drawing Sheets

OTHER PUBLICATIONS

Andreas Umbach; High-speed integrated photodetectors for 40 Gbit/s applications; Active and Passive Optical Components for WDM Communications III; Proceedings of SPIE vol. 5246(2003) No. 1, 2003, pp. 434-442; Bellingham, VA, US; ISSN: 0277-786X; XP-002333520.

Stéphane Demiguel et al; "Analysis of Partially Depleted Absorber Waveguide Photodiode"; Journal of Lightwave Technology, vol. 23, No. 8, Aug. 1, 2005; pp. 2505-2512; XP-002372447.

Stephane Demiguel et al; "Very High-Responsivity Evanescently Coupled Photodiodes Integrating a Short Planar Multimode Waveguide for High-Speed Applications"; IEEE Photonics Technology Letters, vol. 15, No. 12, Dec. 2003; pp. 1761-1763; XP-002372448.

Joe C. Campbell et al; "Recent Advances in Avalanche Photodiodes"; IEEE Journal of Selected Topics In Quantum Electronics, vol. 10, No. 4, Jul./Aug. 2004; pp. 777-787; XP-002372449.

S. Demiguel et al; "High-responsivity and high-speed evanescently-coupled avalanche photodiodes"; Electronic Letters Dec. 11, 2003 vol. 39 No. 25; pp. 1848-1849; ISSN: 0013-5194; XP-006024539.

Stephane Demiguel et al; "Partially depleted absorber waveguide photodiodes"; Lasers and Electro-Optics Society, 2004. Leos 2004. The 17th Annual Meeting of the IEEE Rio Grande, Puerto Rico Nov. 8-9, 2004, Piscataway, NJ, USA, IEEE, vol. 1, Nov. 8, 2004; pp. 216-217; XP-010748596.

M. Achouche et al; "New All 2-inch manufacturable high performance evanescent coupled waveguide photodiodes with etched mirrors for 40 Gb/s optical receivers"; Optical Fiber Communcation Conference. (OFC). Postconference Digest. Atlanta, GA, Mar. 23-28, 2003; Trends in Optics and Photonics Series. (TOPS), Washington, DC OSA, US, vol. TOPS. Vol. 86, Mar. 23, 2003, pp. 341-342, ISBN: 1-55752-746-6; XP-010680111.

M. Achouche et al; "Manufacturable 2.5 Gbit/s edge-coupled waveguide photodiode for optical hybrid-intergrated modules"; Optical Communication, 2001. ECOC '01. 27th European Conference On Sep. 30-Oct. 4, 2001, Piscataway, NJ, USA, IEEE, vol. 4, Sep. 30, 2001; pp. 552-553; ISBN: 0-7803-6705-7; XP-010582680.

Vincent Magnin et al; "Design, Optimization, and Fabrication of Side-Illuminated p-i-n Photodectors With High Responsivity and High Alignment Tolerance for 1.3- and 1.55-MUM Wavelength Use"; Journal of Lightwave Technology, vol. 20, No. 3, Mar. 2002; New York, NY, US; p. 477,479, 480, 481; ISSN: 0733-8724; XP-001130096.

Vincent Magnin et al; "Design and Optimization of a 1.3/1.55-micrometer Wavelength Selective p-i-n Photodiode based on Multimode Diluted Waveguide"; IEEE Photonics Technolgy Letters, vol. 17, No. 2, Feb. 1, 2005, pp. 459-461; XP-002372450.

Vincent Magnin et al.: "Design and Optimization of a 1.3/1.55-um Wavelength Selective p-i-n Photodiode Based on Multimode Diluted Waveguide"; IEEE Photonics Technology Letters(manuscript received May 26, 2004).

Vincent Magnin et al.: "Design and Optimization of a 1.3/1.5-um Wavelength Selective p-i-n Photodiode Based on Multimode Diluted Waveguide": IEEE Photonics Technology Letters(Manuscript received May 26, 2004).

A.M. Maras: "Polarisation-Dependent Modal Properties of Diluted Mulitple-Quantum-Well Optical Waveguides"; Electronics Letters 17th Aug. 189; vol. 25 No. 17; pp. 1162-1164.

* cited by examiner

INTEGRATED OPTOELECTRONIC DEVICE INCLUDING A SEMICONDUCTOR OPTICAL AMPLIFIER AND A PHOTODIODE

The field of the invention is that of optoelectronic devices for receiving high bit rate digital optical signals for telecommunications applications.

Very briefly, a digital optical signal transmission system comprises three main assemblies, namely:
- an optoelectronic assembly for transducing electrical signals into optical signals;
- a fibre-optic device transmitting the digital optical signals;
- an optoelectronic assembly for transducing and decoding the optical signals into electrical signals.

The invention relates to the latter assembly. As a general rule, there are two main families of devices of this type.

Figure 1:
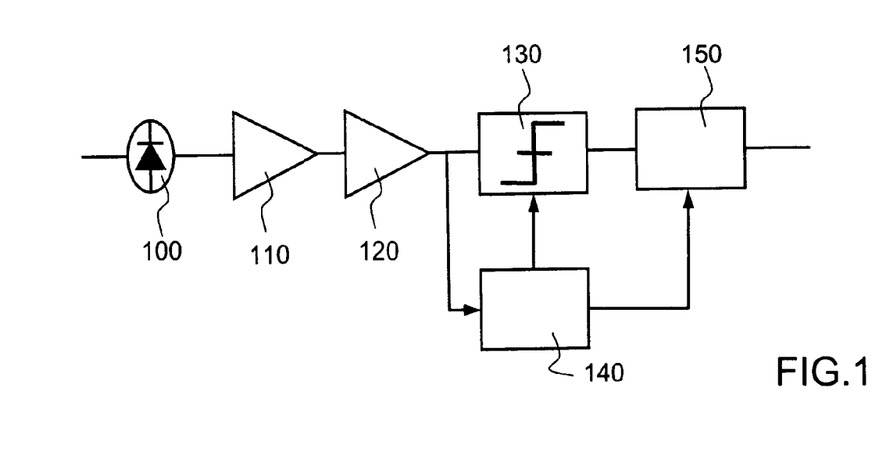
FIG. 1 represents the block diagram of a first optoelectronic assembly for transducing and decoding optical signals into electrical signals.

FIG. 1 represents the block diagram of a first type of device. In this case, the device comprises a photodiode 100 which converts the optical signal into an electrical signal. This diode is, for example, of PIN type, standing for positive-intrinsic-negative, or APD type, standing for avalanche photodiode. This signal is then pre-amplified by a first amplifier 110, for example of TIA type, standing for trans-impedance amplifier, then by a second amplifier denoted 120. The duly amplified signal then has an amplitude high enough to be analysed by a set of electronic circuits 130, 140 that handle both resynchronization of the logic signals and validation of their binary value. The duly processed digital signal can then pass through a demultiplexing circuit 150 when the bit rate is very high. There can thus be a transition, for example, from one digital signal with a frequency of 40 gigabits/second to four digital signals with a frequency of 10 gigabits/second. One drawback of this device is that it can operate only with optical signals having an adequate signal/noise ratio. In practice, the electronic amplification system, which necessarily includes a large number of electronic components, adds significant noise, sufficient to limit system performance.

Figure 2:
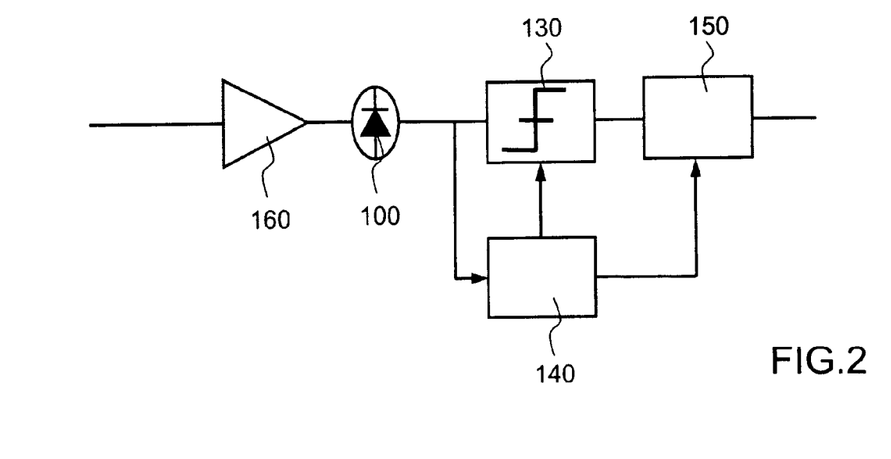
FIG. 2 represents the block diagram of a second optoelectronic assembly for transducing and decoding optical signals into electrical signals.

FIG. 2 represents the block diagram of the second type of device. In this case, the optical signal is first pre-amplified in a semiconductor optical amplifier 160, also called SOA, or by an erbium-doped fibre amplifier, also called EDFA, then the duly amplified signal is converted by means of a photodiode 100 into an electrical signal. The other parts of the device are identical to those of the first type and include a set of electronic circuits that handle both resynchronization of the logic signal and validation of their binary value. It is thus possible to separately optimize the signal/noise ratio, limited by the SOA, and the speed, limited by the bandwidth of the photodiode. The result is a better signal/noise ratio making it possible to process weaker signals with higher bit rates.

Generally, the two optical amplification and optical-electrical conversion functions are associated in a hybrid manner. However, monolithic integrations are beginning to appear, enabling production costs and footprint to be reduced and reliability to be increased. However, such integration poses a certain number of technical problems. In practice, the active region of the optical amplifier and of the photodiode are necessarily common so as to couple, losslessly, the optical beams passing from one to the other. Now, the active area of the amplifier must be thin so as to ensure a strong signal-to-noise ratio and a good linearity. Conversely, to obtain a photodiode with high sensitivity, the active area needs to be sufficiently thick. In practice, the sensitivity of the photodiode depends on the volume of its active area. If this active area has a small cross section, it then necessarily has a long length. Now, an active area with elongated shape has a high capacitance which limits the bandwidth of the photodiode.

Thus, in a device in which the active area of the SOA and of the photodiode have the same thickness, the length of the active area of the photodiode had to be extended to 80 microns so as to retain the sensitivity, at the cost of a bandwidth lower than 40 gigahertz. To obtain the desired bandwidth, the length of the active area could not exceed 25 microns.

Figure 3:
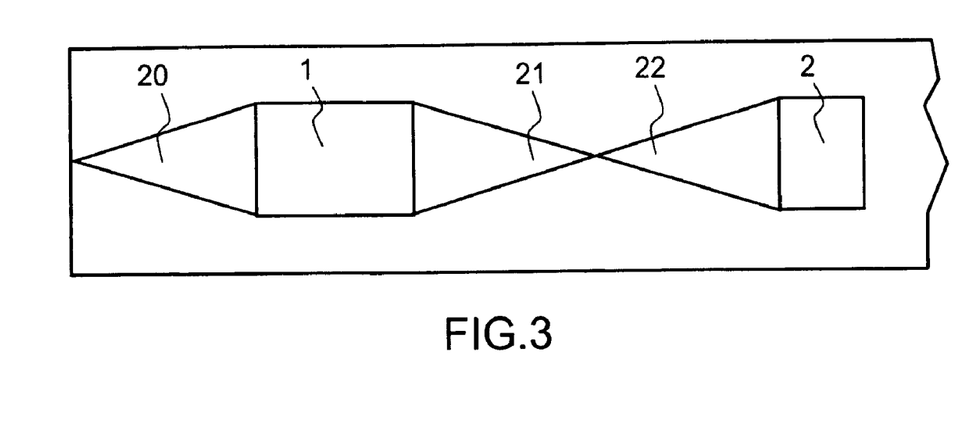
FIGS. 3 and 4 represent a top view and a side view of an optoelectronic photoreception assembly according to the prior art.
Figure 4:
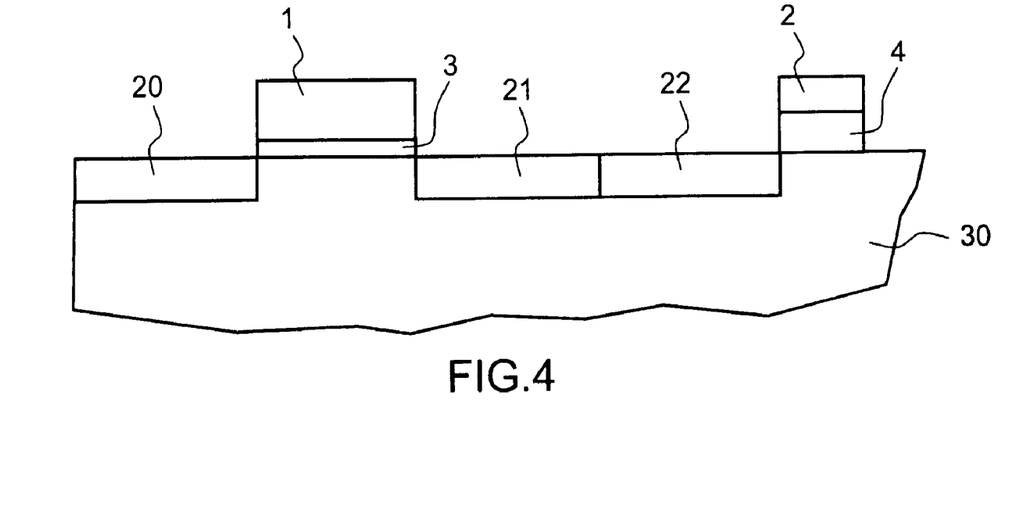

To optimize the conversion device as a whole, it is therefore necessary to have an active area of small cross section in the amplifier part and of larger cross section in the conversion part. To provide this function, optical mode adapters, or "tapers", are normally used. FIGS. 3 and 4 respectively represent a top view and a side view of a device of this type. It comprises, in turn:
- a first "taper" 20 with triangular cross section;
- an optical amplifier 1 of SOA type;
- a second set of "tapers" 21 and 22;
- finally, the receive photodiode 2.

In these figures, the electrodes for optical amplification and conversion of the optical signal into an electrical signal are not represented.

As can be seen in FIG. 4, the active area 4 of the receive photodiode 2 is thicker than the active area 3 of the optical amplifier 1 so as to optimize the performance of the device. The second set of "tapers" 21 and 22 perfectly adapts the size of the optical modes so as to retain correct transmission efficiencies from the optical amplifier to the photodiode.

However, technologically producing such an assembly is difficult. It is, of course, not possible to produce perfect tapers that transmit the optical modes losslessly. The dry etch production method cannot be used to produce perfectly flat surfaces. Now, the residual roughness impairs the propagation of the optical beams. The assemblies produced by this method show that the final gain of the SOA, given the losses introduced by the tapers, does not exceed 10 dB.

The object of the invention is to overcome the drawbacks arising from the use of "tapers" by replacing these structures with a unique structure consisting of diluted multimode waveguide (also named as multimode diluted waveguide).

More specifically, the subject of the invention is an optoelectronic photoreception device for an optical signal comprising at least a structure with an optical amplification section comprising a first active area and a photoreception section comprising a second active area, characterized in that said structure includes a diluted multimode waveguide common to both sections, the first active area and the second area being disposed so as to ensure a coupling by evanescent waves with said diluted multimode waveguide.

Advantageously, the first active area has a thickness less than that of the second active area and the optical amplification section is of SOA type.

More specifically, the diluted multimode waveguide includes at least one stack of 2N layers that are thin, flat and parallel to each other, regularly alternating and with index numbers $C_i$, the layers preferably being made of a quaternary type material InGaAsP. More specifically, the layers with an even index number are made of InP, the layers with an odd index number being made of InGaAsP. Preferably, the number N is 5, the layers made of InGaAsP all have a thickness of approximately 0.16 microns and the layers made of InP have a thickness of between 0.36 microns and 0.66 microns.

Furthermore, the diluted multimode waveguide can include an index tuning layer partly located under the active areas, said layer being made of InGaAsP.

Advantageously, the first active area of the amplification section comprises a layer of GaInAs which can be live, for example, at −0.32% and the second active area of the photoreception section comprises a layer of GaInAs.

Furthermore, the structure of the SOA includes at least two identical separate confinement heterostructures SCH located above and below the first active area. Each separate confinement heterostructure can be made of InGaAsP and has a thickness of 30 nanometres.

The invention will be better understood and other advantages will become apparent from reading the description that follows, given by way of nonlimiting example, and from the appended figures, in which.

Figure 5:
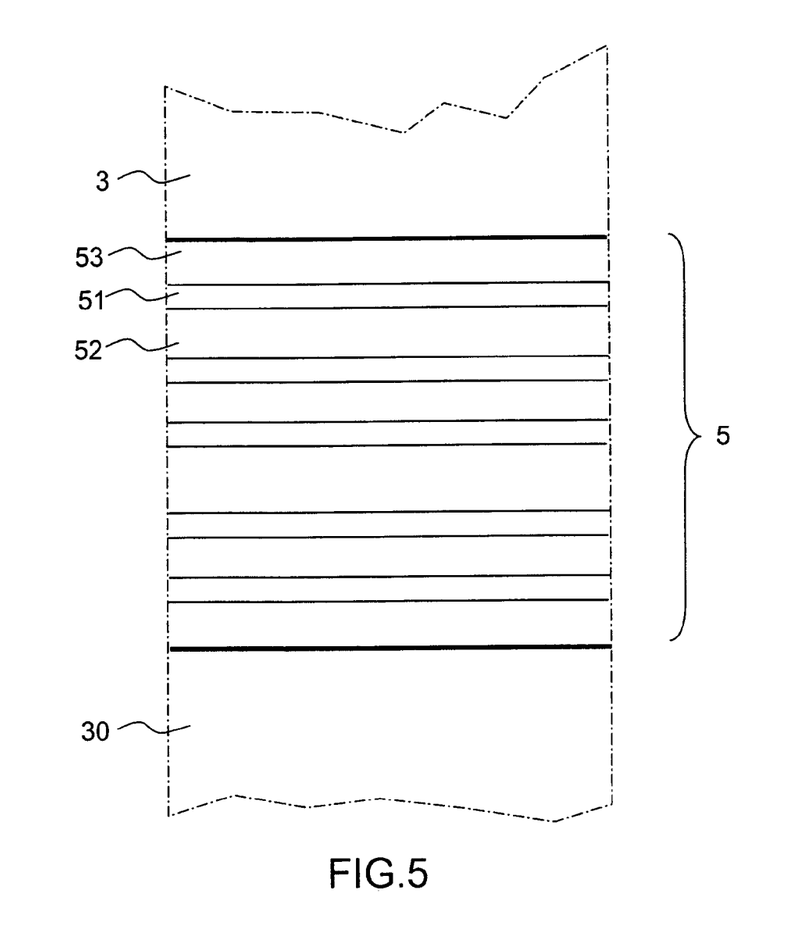
FIG. 5 represents a cross-sectional view in a plane perpendicular to the layers of a diluted multimode waveguide.

A diluted multimode waveguide 5 comprises a stack of thin layers 51, 52 that are flat and parallel to each other, as represented in FIG. 5. Generally, the diluted multimode waveguide 5 comprises at least one stack of 2N layers regularly alternating and with index numbers $C_i$ resting on a substrate 30. Its thickness is a few microns.

As an example, the layers with even index numbers can be made of InP, the layers with odd index numbers being made of InGaAsP, the stack comprising 10 layers. The layers made of InGaAsP all have a thickness of approximately 0.16 microns and the layers made of InP have a thickness of between 0.36 microns and 0.66 microns.

The diluted multimode waveguide can include an index tuning layer 53 partly located under the active areas. This layer can be made of InGaAsP.

Figure 6:
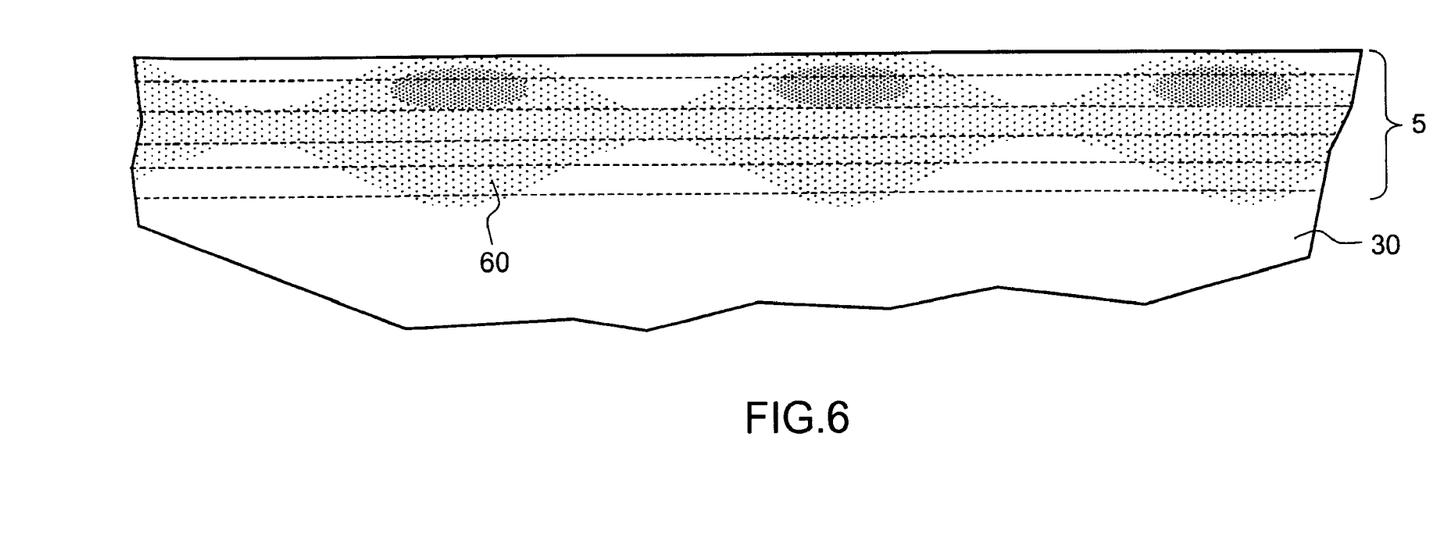
FIG. 6 represents the propagation of the optical modes in a diluted multimode waveguide.

The propagation of light in this type of waveguide comprising numerous layers of dimensions smaller than that of the wavelength of the light cannot easily be calculated. Also, beam propagation method BPM type simulation software is used and simulations can be done in 2D or in 3D. Such software makes it possible to simulate the propagation of the light in a diluted multimode waveguide. The simulations show that the intermodal beating makes the propagation of the light a periodic phenomenon, the amplitude of the period measuring some tens of microns. FIG. 6 highly schematically shows the amplitude variations of the light in a plane perpendicular to the average plane of the layers and parallel to the direction of propagation. The light energy density 60 inside the waveguide is represented by a more or less dense distribution of dots in FIG. 6. By judicious distribution of the layers, the light energy can be periodically concentrated near to the interface, as indicated in FIG. 6.

Thus, by having an active area on these energy concentration areas, it is possible to couple the evanescent wave in the active area with a high efficiency coupling.

This property is used to produce an optoelectronic photoreception device according to the invention.

Figure 7:
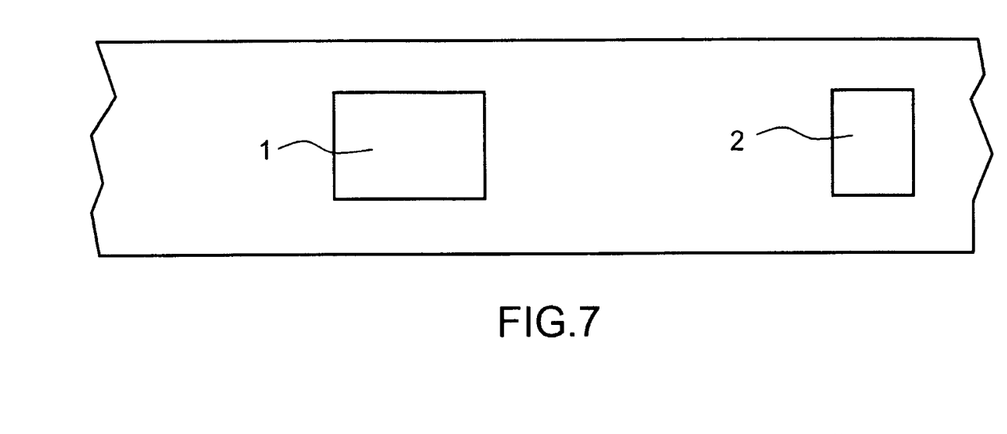
FIGS. 7 and 8 represent a top view and a side view of an optoelectronic photoreception assembly according to the invention.
Figure 8:
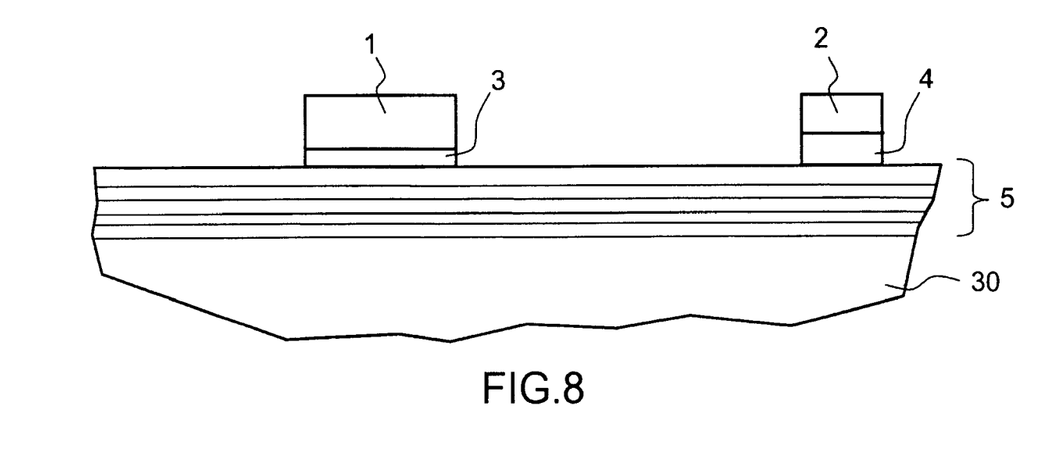
Figure 9:
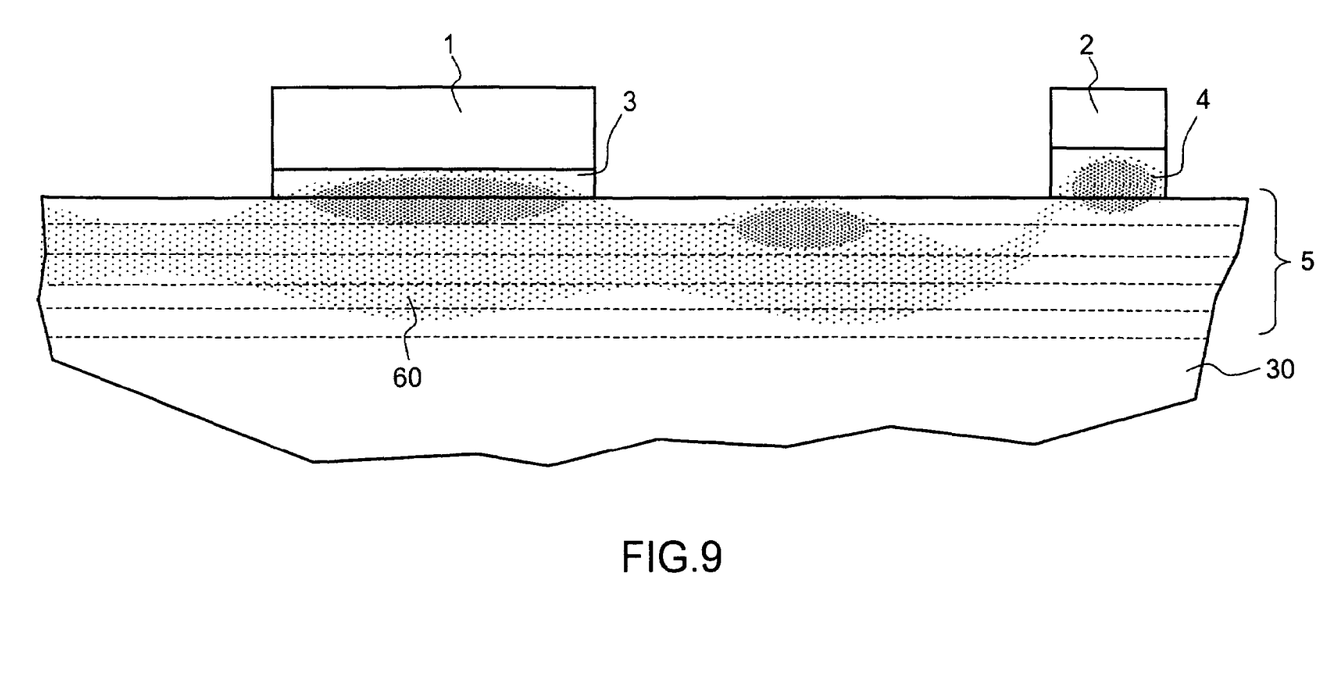
FIG. 9 represents the propagation of the optical modes in an optoelectronic photoreception assembly according to the invention.

FIGS. 7 and 8 respectively represent a top view and a side view of a device according to the invention. It comprises, in turn:

an optical amplifier 1 of SOA type;
a receive photodiode 2;
a diluted multimode waveguide 5 resting on a substrate 30.

The optical amplifier 1 mainly comprises an active area 3 of small thickness. The photodiode 2 also comprises an active area 4 of greater thickness. The thicknesses of the active area are thus separately optimized. There is then obtained in the optical amplification section a good linearity, a high gain, a low noise and a good independence with respect to the polarization of the light. And, in the photoreception section, a good sensitivity, a high bandwidth and an optical power with optimized saturation are obtained.

The diluted multimode waveguide 5 is common to both sections. The placement of the two active areas 3 and 4 is chosen so as to optimize the coupling of the evanescent waves in the active areas. As has been stated, it is preferable to use BPM type simulation software to achieve this optimization. The periodicity of the propagation of the light in the waveguide allows a degree of freedom in the choice of placement of the optical amplifier and the photodiode. In practice, a change of placement equal to one propagation period does not significantly alter the coupling efficiencies.

As an example, an optoelectronic photoreception device according to the invention comprises a diluted multimode waveguide with a mode propagation period of approximately 50 microns, an optical amplification section approximately 100 microns long and a photoreception section approximately 30 microns long, the two sections being separated by a distance of 60 microns, these various values being chosen so as to ensure an optimal coupling of the evanescent waves circulating in the waveguide with both the amplification section and the photoreception section. The photodiode is of PIN type, optimized to operate with a bandwidth of 40 gigabits per second. It has an active area that is 0.4 microns thick. A conversion quantum efficiency of 80% is thus obtained. In this case, the vertical positioning tolerance of the diluted multimode waveguide intended for use with a lensed-end optical fibre is 1 micron to obtain a coupling loss less than 1 dB.

The invention claimed is:

1. An optoelectronic photoreception device for an optical signal comprising at least a structure with:
    an optical amplification section comprising a first active area and,
    a photoreception section comprising a second active area, characterized in that said structure includes a multimode diluted waveguide common to both sections, the amplification and photoreception sections being separate, one side of the active area of the amplification section and one side of the active area of the photoreception section being in direct contact with said multimode diluted waveguide, the first active area and the second area being disposed so as to ensure a coupling by evanescent waves with said multimode diluted waveguide.

2. The device according to claim 1, wherein the first active area has a thickness less than that of the second active area.

3. The device according to claim 1, wherein the optical amplification section is of SOA type.

4. The device according to claim 1, wherein the multimode diluted waveguide includes at least one stack of 2N layers that are thin, flat and parallel to each other, regularly alternating and with index numbers $C_i$, the layers with an even index number being made of InP, the layers with an odd index number being made of InGaAsP.

5. The device according to claim 4, wherein the number N is 5.

6. The device according to claim 4, wherein the layers made of InGaAsP all have a thickness of approximately 0.16 microns.

7. The device according to claim 4, wherein the layers made of InP have a thickness of between 0.36 microns and 0.66 microns.

8. The device according to claim 1, wherein the multimode diluted waveguide includes an index tuning layer partly located under the active areas.

9. The device according to claim 8, wherein said layer is made of InGaAsP.

10. The device according to claim 1, wherein the first active area of the amplification section comprises a layer of GaInAs.

11. The device according to claim 1, wherein the second active area of the photoreception section comprises a layer of GaInAs.

12. The device according to claim 3, wherein the structure of the SOA includes at least two separate confinement heterostructures known by the acronym SCH, that are identical and located above and below the first active area.

13. The device according to claim 12, wherein the separate confinement heterostructure is made of InGaAsP and has a thickness of 30 nanometres.

* * * * *